(12) United States Patent
Buijsse et al.

(10) Patent No.: US 8,835,846 B2
(45) Date of Patent: Sep. 16, 2014

(54) IMAGING A SAMPLE IN A TEM EQUIPPED WITH A PHASE PLATE

(71) Applicants: FEI Company, Hillsboro, OR (US); Max-Planck-Gesellschaft zur Foerderung der Wissenschaften e.V., Munich (DE)

(72) Inventors: Bart Buijsse, Eindhoven (NL); Marco Hugo Petrus Moers, Best (NL); Radostin Stoyanov Danev, Munich (DE)

(73) Assignees: FEI Company, Hillsboro, OR (US); Max-Planck-Gesellschaft zur Foerderung der Wissenschaften e.V. (DE)

( * ) Notice: Subject to any disclaimer, the term of this patent is extended or adjusted under 35 U.S.C. 154(b) by 0 days.

(21) Appl. No.: 14/015,658

(22) Filed: Aug. 30, 2013

(65) Prior Publication Data
US 2014/0061463 A1    Mar. 6, 2014

Related U.S. Application Data

(60) Provisional application No. 61/694,885, filed on Aug. 30, 2012.

(30) Foreign Application Priority Data

Aug. 30, 2012 (EP) ..................... 12182334

(51) Int. Cl.
    *H01J 37/26* (2006.01)
(52) U.S. Cl.
    CPC ....... *H01J 31/263* (2013.01); *H01J 2237/2614* (2013.01); *H01J 37/26* (2013.01)
    USPC ............ 250/311; 250/306; 250/307; 250/310

(58) Field of Classification Search
    CPC ..... H01J 37/26; H01J 37/28; H01J 2237/216; H01J 2237/221; H01J 2237/2487; H01J 2237/1501; H01J 2237/2614; Y10S 977/869
    USPC .................................. 250/306, 307, 310, 311
    See application file for complete search history.

(56) References Cited

U.S. PATENT DOCUMENTS

| 6,674,078 B2 | 1/2004 | Nagayama et al. |
| 7,737,412 B2 | 6/2010 | Jin et al. |

(Continued)

FOREIGN PATENT DOCUMENTS

JP    2001273866    10/2001

OTHER PUBLICATIONS

Marko, Michael et al., "Retrofit implementation of Zernike phase plate imaging for cryo-TEM," Journal of Structural Biology, Jan. 2011, pp. 400-412, No. 174.

(Continued)

*Primary Examiner* — Nicole Ippolito
*Assistant Examiner* — Hanway Chang
(74) *Attorney, Agent, or Firm* — Scheinberg & Associates, P.C.; Michael O. Scheinberg

(57) ABSTRACT

The invention relates to a method of forming an image of a sample in a transmission electron microscope equipped with a phase plate. Prior art use of such a phase plate can introduce artifacts in the form of ringing and a halo. These artifacts are caused by the abrupt changes in the Fourier domain due to the sharp edges of the phase plate in the diffraction plane. By moving the phase plate with respect to the non-diffraction beam (the diffraction pattern) while recording an image the sudden transition in the Fourier domain is changed to a more gradual transition, resulting in less artifacts.

20 Claims, 6 Drawing Sheets

(56) References Cited

U.S. PATENT DOCUMENTS

Figure 1:
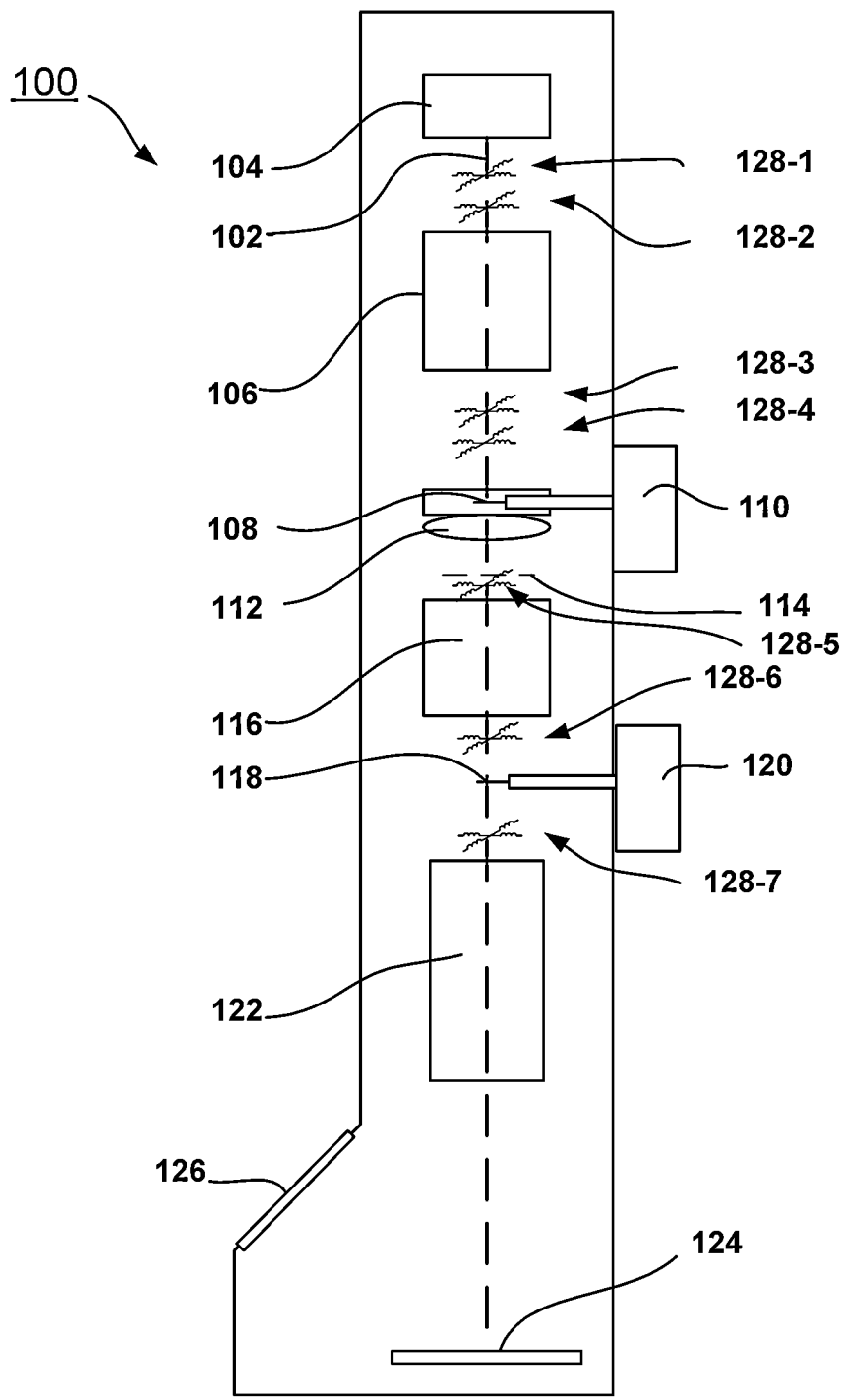

| | | |
|---|---|---|
| 7,915,584 B2 | 3/2011 | Tiemeijer et al. |
| 8,071,954 B2 | 12/2011 | Wagner et al. |
| 8,405,027 B2 | 3/2013 | Lazar et al. |
| 8,487,268 B2 | 7/2013 | Gerthsen et al. |
| 2002/0011566 A1 | 1/2002 | Nagayama et al. |
| 2008/0035854 A1 | 2/2008 | Jin et al. |
| 2011/0174971 A1 | 7/2011 | Malac et al. |
| 2011/0315876 A1 | 12/2011 | Buijsse et al. |
| 2012/0012747 A1 | 1/2012 | Lazar et al. |
| 2012/0199756 A1 | 8/2012 | Buijsse et al. |

OTHER PUBLICATIONS

Nagayama, Kuniaki et al., "Phase Contrast Enhancement with Phase Plates in Biological Electron Microscopy," Microscopy Today, Jul. 2010, pp. 10-13, vol. 18, No. 4.

Danev, Radostin, et al, "Transmission electron microscopy with Zernike phase plate," Ultramicroscopy, 2001, pp. 243-252, vol. 88.

Danev, R., et al., "A Novel Phase-contrast Transmission Electon Microscopy Producting High-contrast Topographic Images of Weak Objects," Journal of Biological Physics, 2002, pp. 627-635, vol. 28.

Danev, Radostin, "Zernike phase contrast cryo-electron tomography," Journal of Structural Biology, 2010, pp. 174-181, vol. 171.

Danev, Radostin, et al., "Methods in Enzymology- Phase Plates for Transmission Electron Microscopy", Elsevier, Oct. 2010, pp. 343-369, Chapter 14.

Glaeser, Robert M., et al., "Minimizing elctrostatic charging of an aperture used to produce in-focus phase contrast in the TEM," Ultramicroscopy, 2013, pp. 6-15, vol. 135.

Glaeser, Robert M., "Invited Review Article: Methods for imaging weak-phase objects in electron microscopy", Review of Scientific Instruments, 2013, pp. 111101-1, 111101-17., vol. 84.

Hettler, Simon, et al., "Improving Fabriction and Application of Zach Phase Plates for Phase-Contrast Transmission Electron Microscopy", Microsc. Microanal., 2012, pp. 1010-1015, vol. 18.

Kuo, Pai-Chai, On-Chip Thin Film Zernike Phase Plate for In-Focus Transmission Electron Microscopy Imaging of Organic Materials, American Chemical Society, 2013, pp. 465-470, vol. 7, No. 1.

Majorovits, E., "Optimizing phase contrast in transmission electron microscopy with an electrostatic (Boersch) phase plate", Ultramicroscopy, 2007, pp. 213-226, vol. 107.

Malac, Marek, "Convenient Contrast enhancement by a hole-free phase plate", Ultramicroscopy, 2012, pp. 77-89, vol. 118.

Marko, Michael, "Methods for testing Zernike phase plates and a report on silicon-based phase plates with reduced charging and improved ageing characteristics", Journal of Structural Biology, 2013, pp. 237-244, vol. 184.

Nagayama, Kuniaki, et al, "Phase contrast electron microscopy: development of thin-film phase plates and biological applications", Phil. Trans. R. Soc. B, 2008, pp. 2153-2162, vol. 363.

Kuniaki, Nagayama, "Another 60 years in electron microscopy: development of phase-plate electron microscopy and biological applications" Journal of Electron Microscopy, 2011, pp. S43-S62, vol. 60, No. 1.

Schultheiss, K., "Fabrication of a Boersch phase plate for phase contrast imaging in a transmission electron microscope" Review of Scientific Instruments, 2006, pp. 033701-1, 033701-4, vol. 77.

Schultheiss, Katrin, et al., "New Electrostatic Phase Plate for Phase-Contrast Transmission Electron Microscopy and Its Application for Wave-Function Reconstruction", Microsc. Microanal., 2010, pp. 785-794, vol. 16.

Ishizuka, Kazuo, et al., "Phase Measurement in Electron Microscopy Using the Transport of Intensity Equation," Microscopy Today, May 2005, pp. 22-24.

Nagayama, Kuniaki, et al., "Phase contrast electron microscopy: development of thin-film phase plates and biological applications," Phil. Trans. R. Soc. B, 2008, pp. 2153-2162, vol. 363.

Unwin, P.N.T., et al., "Phase contrast and interference microscopy with the electron microscope", Phil. Trans. Roy. Soc. Lond. B., 1971, pp. 95-104, vol. 261.

Zemlin, F., "Image Formation in High-Resolution Electron Microscopy," Cryst. Res. Technol., 1998, pp. 1097-1111, vol. 33, No. 7-8.

Danev, Radostin, et al., 'Optimizing the phase shift and the cut-on periodicity of phase plates for TEM,' Ultramicroscopy, Apr. 30, 2011, pp. 1305-1315, vol. 111.

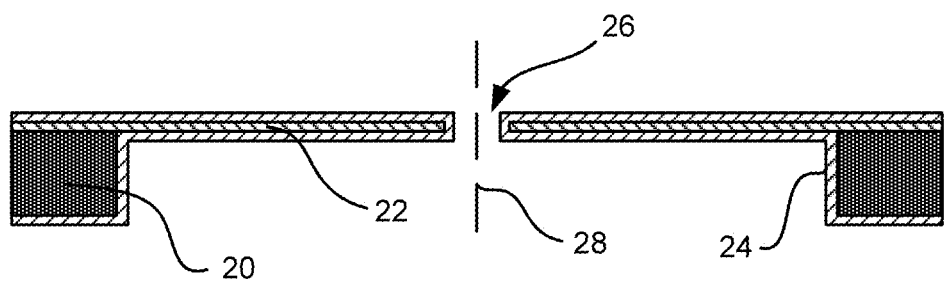
FIG. 2
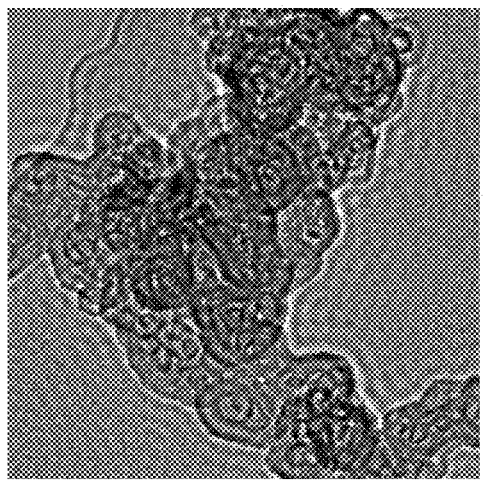 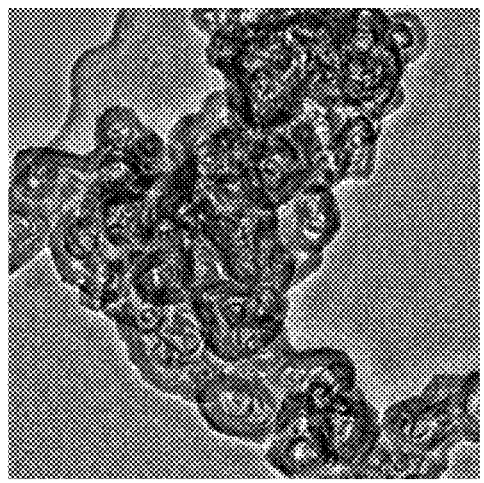
FIG. 3ᵃ          FIG. 3ᵇ

Figure 4E:
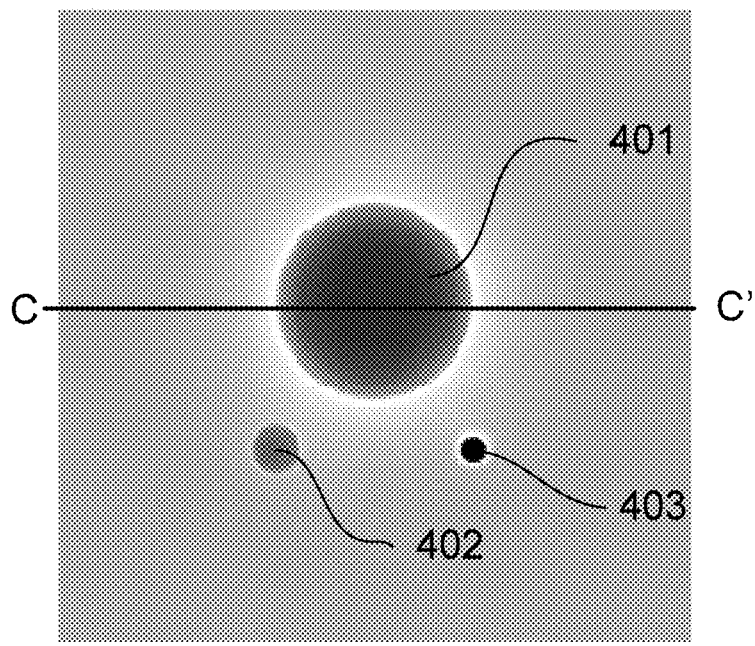
Figure 4F:
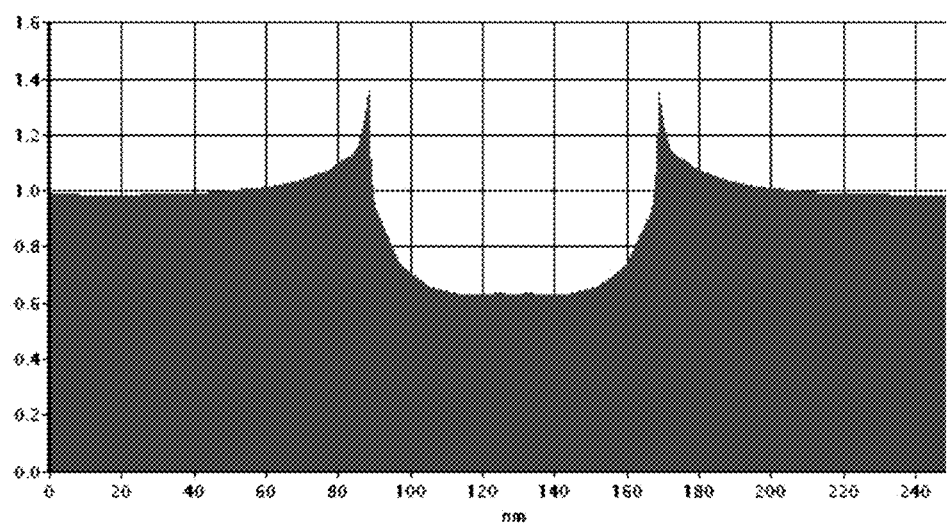

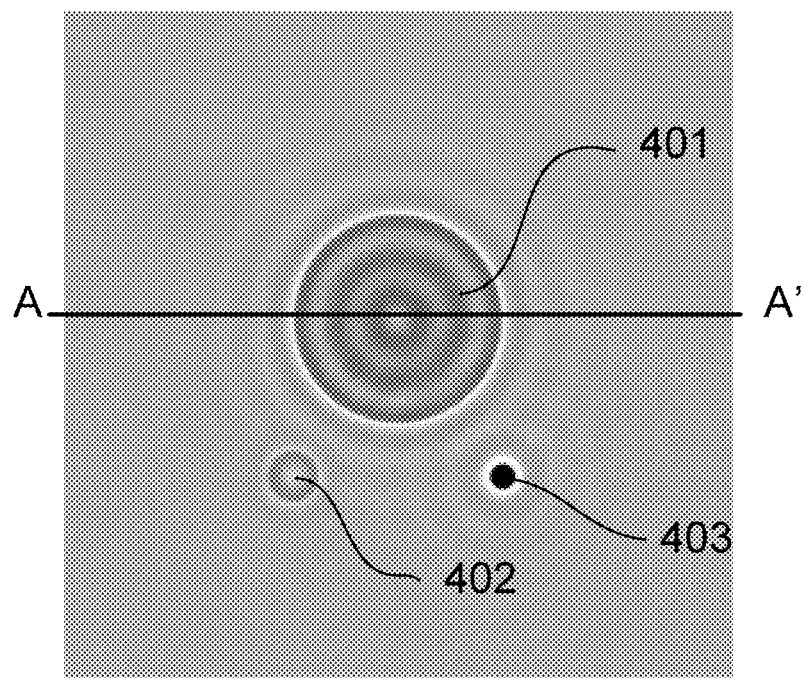
FIG. 4ᵃ
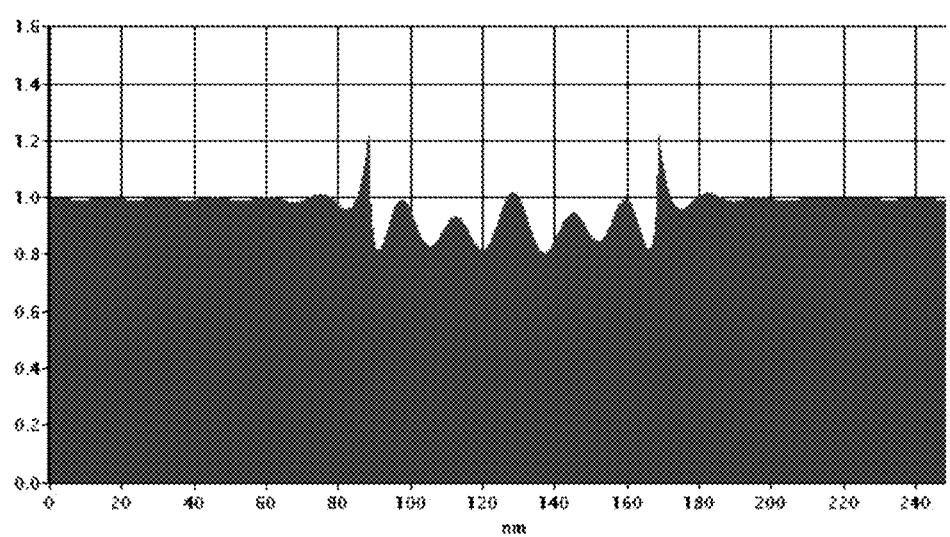
FIG. 4ᵇ

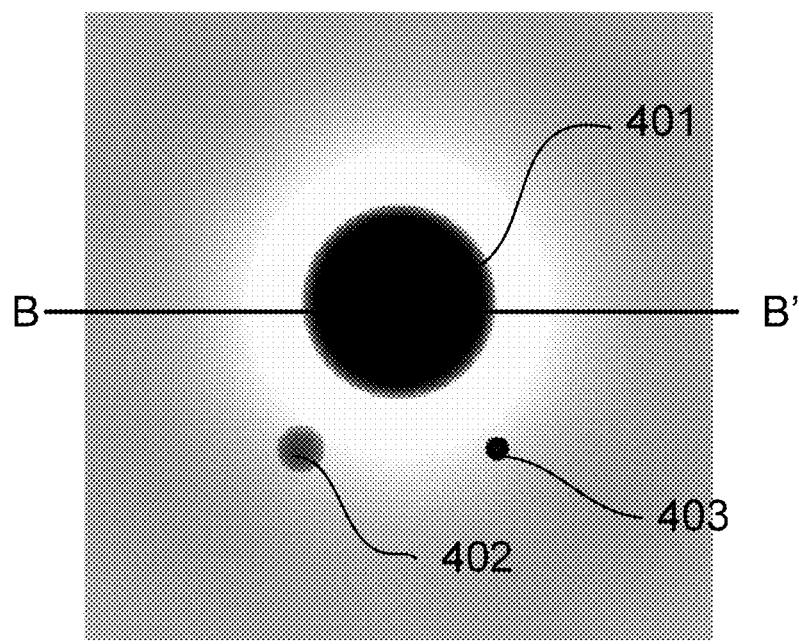
FIG. 4$^c$
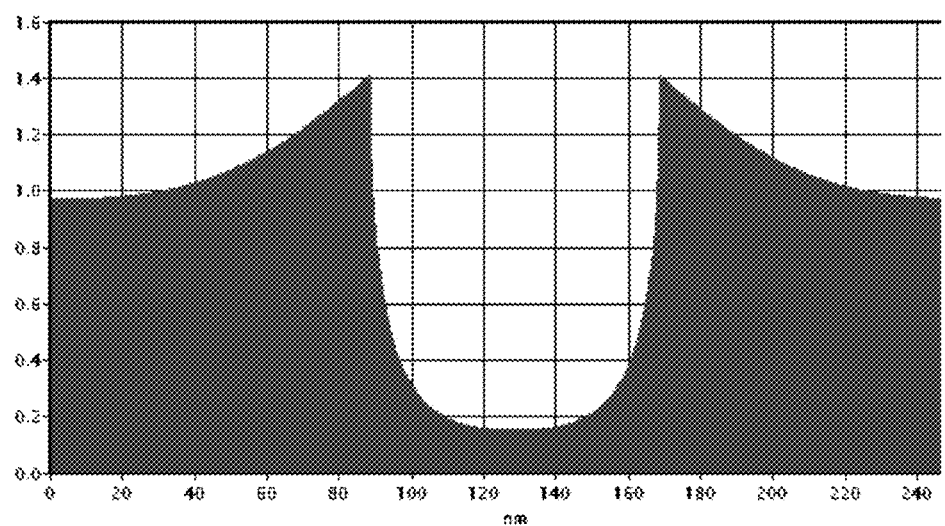
FIG. 4$^d$

IMAGING A SAMPLE IN A TEM EQUIPPED WITH A PHASE PLATE

This application claims priority from U.S. Provisional Application 61/694,885, filed Aug. 30, 2012, which is hereby incorporated by reference.

The invention relates to a method of forming an image of a sample in a transmission electron microscope, the sample irradiated by a beam of electrons and the sample splitting the beam of electrons in a beam of undiffracted (non-scattered) electrons and beams of diffracted (scattered) electrons, the electron microscope equipped with a contrast enhancing device from the group of phase plates, Foucault device or Hilbert device, the contrast enhancing device for improving the contrast at low spatial frequencies, the contrast enhancing device positioned in the back focal plane of the objective lens or in an image of said plane, the contrast enhancing device showing a position with respect to the beam of unscattered electrons.

Such a method is known from "Phase Contrast Enhancement with Phase Plates in Biological Electron Microscopy", K. Nagayama et al., Microscopy Today, Vol. 18 No. 4 (July 2010), pp. 10-13, further referred to as Nagayama [-1-].

In a Transmission Electron Microscope (TEM) a sample is irradiated with a substantially parallel beam of electrons with a selectable energy of typically between 50 and 300 keV, although higher and lower energies are known to be used. The sample is a very thin sample, with a thickness of typically between 20 nm and 1 µm. As a result part of the electrons pass through the sample, some of the electrons unscattered (thus: without changing energy or direction), some of them scattered elastically (thus: without or hardly changing energy but with a change of direction) and some of them scattered inelastically (thus: with a change in both direction and energy). Both the elastically scattered electrons, also known as the diffracted electrons, and the unscattered electrons are imaged by strongly magnifying lenses in the image plane, where the diffracted and unscattered electrons interfere with each other to form an image.

It is noted that other contrast mechanisms also contribute to the image, such as the local absence of electrons that are locally absorbed in the sample, or electrons that are absorbed by the contrast enhancing device Especially biological samples, comprising mainly low-Z materials, show weak phase images. The contrast is a function of the spatial frequency, and especially at low spatial frequencies the contrast is low. This is described by the Contrast Transfer Function (CTF) as shown in Nagayama [-1-], more specifically FIG. 2. The reason for this is that at low spatial frequencies the electrons are diffracted over a small angle and the phase difference of diffracted and undiffracted electrons is small.

To improve the contrast at low spatial frequencies a phase plate can be introduced in the back-focal plane of the objective lens, also known as the diffraction plane. The back-focal plane of the objective lens is a Fourier representation of the image, and at this plane the angle under which electrons are scattered results in different positions in this plane. In this plane it is possible to introduce, for example, a phase shift of $-\pi/2$ to all electrons except the unscattered beam. Interference of the now phase shifted scattered beam with the non-phase shifted undiffracted electrons results in a much higher CTF, as shown in aforementioned FIG. 2 of Nagayama [-1-].

Nagayama [-1-] describes several contrast enhancing devices to be used in the diffraction plane. When discussing the so-called Zernike phase plate, this is a thin film with a thickness causing a phase shift of approximately $-\pi/2$ for the electrons passing through it. It is a carbon film, and almost all electrons pass through it without absorption or scattering. In the center of the film a small hole is formed for passing the beam of unscattered electrons. As a result a phase shift of $\pi/2$ between scattered and unscattered electrons is caused, and the phase variation is changed to an amplitude variation (the sine like CTF is changed to a cosine like CTF).

A disadvantage of this phase plate is that the image shows artifacts in the form of "ringing": due to the abrupt edge of the phase plate a sudden transition in the Fourier domain from $0 \rightarrow -\pi/2$ is introduced, resulting in ripples in the normal image plane. This is explained in more detail in "Optimizing the phase shift and the cut-on periodicity of phase plates for TEM", R. Danev et al., Ultramicroscopy 111 (2011) pages 1305-1315, further referred to as Danev [-2-].

Another disadvantage of said phase plate is that small irregularities of the thin film, or of small dust motes thereupon, cause local disturbance of the phase.

Yet another disadvantage is that the hole needs to be a very small hole, as all electrons passing through the hole have the same phase shift, and thus all these electrons show little contrast. The hole diameter determines the acceptance angle of electrons passing through it, and thus the spatial frequency at which contrast enhancement starts. Following the definition of "cut-on periodicity" as stated in Danev [-2-] at page 1305, right column ("the cut-on periodicity corresponds to the spatial frequency of the phase CTF onset and is inversely proportional to the central hole diameter of the phase plate. Fringing artifacts can be very prominent in vitrified cell applications . . . ") the "cut-on periodicity" or "cut-on frequency" should be as small as possible to achieve contrast at as low a spatial frequency as possible.

An associated problem is that the (undiffracted) beam needs to be very well centered with respect to the contrast enhancing structure.

The invention intends to provide a solution to the above mentioned problems.

To that end the method according to the invention is characterized in that during the formation of the image the mutual position of the contrast enhancing device and the beam of unscattered electrons is changed.

By moving the contrast enhancing device, for example the phase plate, with respect to the beam of unscattered electrons (and the rest of the diffraction pattern, as the contrast enhancing device is placed in the diffraction plane) while imaging, the sudden transition in the Fourier domain due to the edge discontinuity is blurred, effectively forming a gradual transition. As a result the ringing is strongly suppressed.

Preferably the mutual movement takes the form of a circular movement of the contrast enhancing device relative to the undiffracted electrons which is fast compared to the image acquisition time. Typically a movement of between 1 and 50 revolutions per second, more specifically between 5-20 revolutions per second is proposed. For this reason such a contrast enhancing device is also called an orbiting mode contrast enhancing device (e.g. orbiting mode phase plate).

The amplitude of the movement should be such that the undiffracted beam always passes through the hole, so the diameter of the circular movement should be less than the diameter of the hole and the circular movement should be concentric with the hole perimeter.

Small irregularities on the thin film (small compared to the movement of the mutual position, so small compared to the diameter of the hole), such as micrometer and sub-micrometer dust particles, are smeared out and have less effect on the image. This also holds for differences in the potential of the foil or, in the case of a Foucault device, the knife edge, resulting from e.g. crystallographic changes or changes/implantations leading to different electron band energies.

It is noted that the mutual movement is easily realized by tilting the beam at the plane where the sample resides (a conical tilt), but that it is also possible to move the contrast enhancing device with respect to the microscope (and thus the beam of unscattered electrons), for example using piezo-actuators.

An associated advantage is that for the phase plate according to the invention the diameter of the hole need not be as small as for the phase plate used in the conventional method: for all electrons passing at a distance larger than the smallest distance from the undiffracted beam to the edge of the hole at least a part of the electrons passes through the thin film, thus experiencing a phase shift with the associated improvement in contrast.

In an embodiment the TEM is equipped with means to measure a signal proportional to the current intercepted by the contrast enhancing device Although the electron transparency of the thin film is large, a part of the electrons are intercepted. By measuring the intercepted current while moving the beam with respect to the thin film, the centering of the beam with respect to the hole in the thin film can be measured. Hereby centering of the contrast enhancing device with respect to the beam is achieved.

It is mentioned that the measuring capability also enables matching the (fixed) diameter of the hole and the (variable) diameter of the circular movement. The signal can also be used to minimize ellipticity of the assumed circular movement, analog to the method mentioned in EP publication No. EP2485240A1. This is true when deflecting the beam in a circular fashion using electric or magnetic fields, or when mechanically moving the phase plate.

The invention will now be elucidated using figures, in which identical numerals indicate corresponding features. To that end:

FIG. 1 schematically shows a TEM with a phase plate;

FIG. 2 schematically shows a Zernike phase plate;

FIG. $3^a$ shows an image obtained with a TEM with a conventional phase plate;

FIG. $3^b$ shows an image obtained with a TEM with an orbiting mode phase plate.

FIG. $4^a$ shows a computer simulated image of a prior art phase plate with a central hole of 1000 nm;

FIG. $4^b$ shows the intensity through line AA' in FIG. $4^a$.

FIG. $4^c$ show a simulated image obtained with a prior art phase plate with a central hole of 100 nm;

FIG. $4^d$ shows the intensity through line BB' in FIG. $4^c$.

FIG. $4^e$ show a simulated image obtained with a orbiting mode phase plate with a central hole of 1000 nm;

FIG. $4^f$ shows the intensity through line CC' in FIG. $4^e$.

Figure 5:
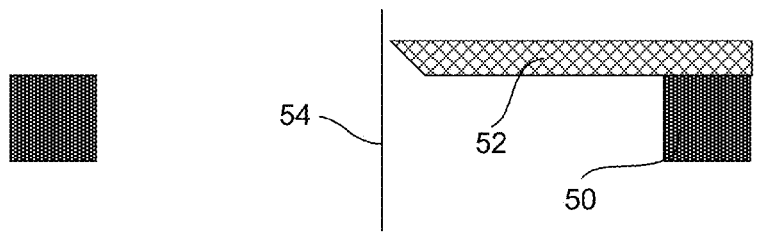

FIG. 5 shows a view of a Foucault knife.

Figure 6:
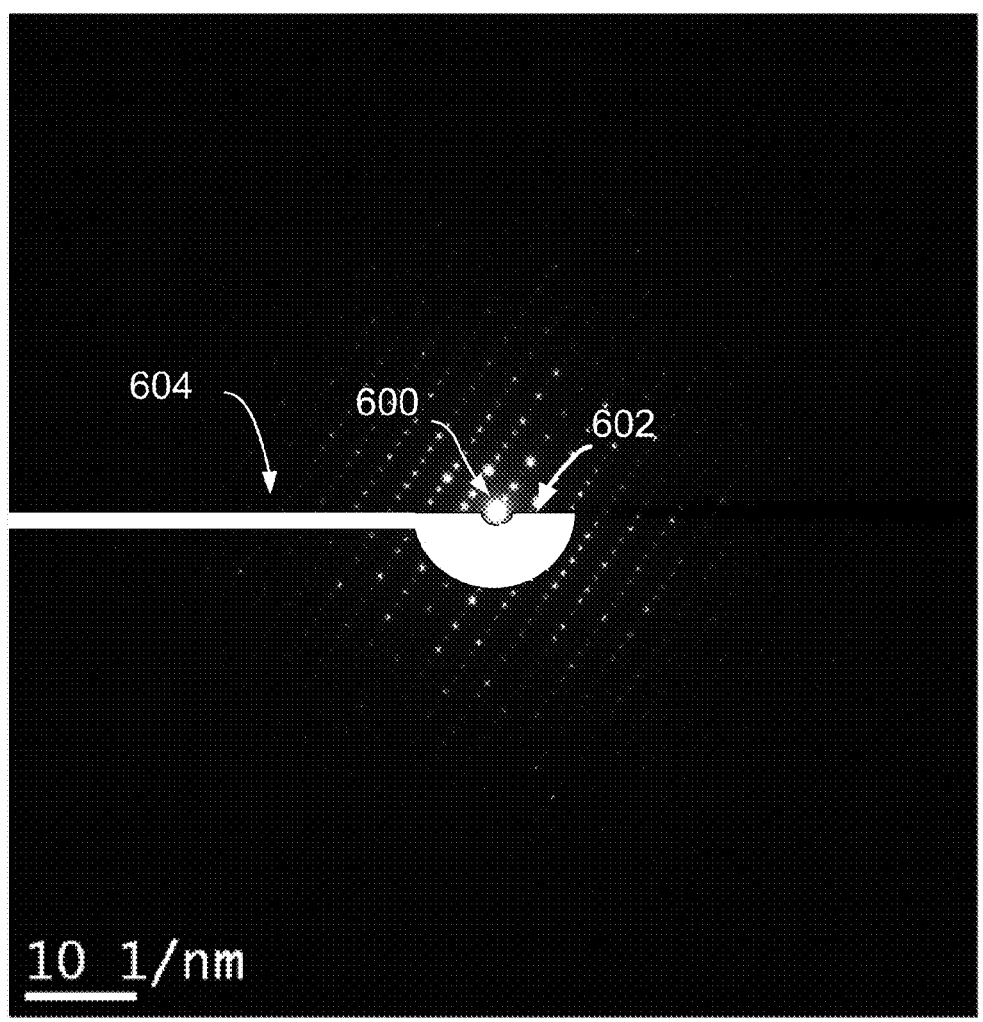

FIG. 6 schematically shows a diffraction pattern overlaid with a variant of the Foucault knife.

FIG. 1 schematically shows a TEM 100 equipped with a phase plate.

FIG. 1 shows a particle source 104 producing a beam of particles, such as electrons, along optical axis 102. The particles have a selectable energy of typically between 80-300 keV, although higher energies, e.g. 400 keV-1 MeV, or lower energies, e.g. 50 keV, may be used. The beam of particles is manipulated by condenser system 106 to form a parallel beam impinging on a sample 108, the sample positioned with a sample holder 110. The sample holder can position the sample with respect to the optical axis and may shift the sample in the plane perpendicular to the optical axis and tilt the sample with respect to said axis. Objective lens 112 forms a magnified image of the sample. The objective lens is followed by a magnifying system 116, e.g. a doublet of lenses, forming an enlarged image of the back-focal plane 114 of the objective lens. A phase plate 118 is placed in the enlarged image of the back-focal plane of the objective lens, this conjugated plane positioned between the magnifying system and a projection system 122. The phase plate is positioned with a manipulator 120, allowing the phase plate to be centered round the optical axis. The projection system forms a magnified image of the sample on a detector 124, thereby revealing sample details of e.g. 0.1 nm. The detector may take the form of a fluorescent screen, or e.g. a CCD or CMOS camera. In the case of e.g. a fluorescent screen the screen can be viewed via the glass window 126.

To align the optical components on the axis the TEM comprises a large number of deflectors, schematically shown as 128-1 . . . 128-7, although other deflectors on other places may be included.

It is noted that the phase plate may also be positioned in the back-focal plane itself, in which case the magnifying system 116 is superfluous.

FIG. 2 schematically shows a Zernike phase plate.

Such a phase plate is discussed in e.g. Nagayama [-1-]. The known phase plate comprises a holder structure 20 in the form of, for example, a standard platinum diaphragm with an aperture, as routinely used in electron microscopes. The outer diameter of such a standard platinum diaphragm is typically 3.05 mm, although other diameters are used. On this holder structure a thin foil 22 of amorphous carbon is placed. As such foils are often contaminated with charging particles or such like (not shown), one of the last fabrication steps involves covering the layer 22 with a carbon coating 24. The carbon coating is typically made by vacuum evaporation, resulting in an additional amorphous carbon layer. The centre of the foil shows a through-hole 26 for passing the undiffracted beam. This hole 26 has a diameter sufficient to pass the undiffracted beam, but preferably not much more, as then slightly scattered electrons, corresponding with electrons scattered by large structures (low spatial frequencies) do not pass through the foil to get the required phase shift but instead through the central hole. Typically the through-hole shows a diameter of less than 1 μm, formed in the foil using a focused ion beam. The phase plate preferably shows rotational symmetry around axis 28. It is noted that the undiffracted beam should also be well aligned round this axis 28.

The electrons passing through the carbon exhibit a phase shift as a result of the internal potential of the carbon. It is noted that this phase plate uses a round diaphragm as holder structure (support structure), but that also silicon structures (with a round or square inner or outer perimeter) are known to be used. Such a silicon phase plate can be made using lithographic techniques, optionally combined with ion beam milling for forming the central through-hole in the thin film. It is further noted that traditionally carbon is used for the thin film of phase plates. However, other materials such as silicon may be used.

FIG. $3^a$ shows an image obtained in a microscope equipped with a phase plate.

As known to the skilled artisan the image in the back-focal plane of the objective lens 112, also known as the diffraction plane, is equivalent to the object (sample) function in Fourier space. The phase plate 118 causes a phase shift for all electrons impinging and travelling through the film, and causes no phase shift for all electrons passing through the central hole. In other words: the phase plate causes a phase shift for all electrons scattered by structures with a spatial frequency above a threshold value, the threshold value given by the diameter of the hole, and causes no phase shift for electrons scattered by structures with a spatial frequency below said threshold value, or not scattered at all.

It is noted that the change in phase shift is an abrupt change.

While taking this image, the undiffracted beam was well-centered and stationary with respect to the phase plate. The large structure is well visible, due to the use of a phase plate. What is also well visible is the "ringing" in the image due to the abrupt change in the phase.

FIG. $3^b$ shows an image obtained with a TEM with orbital mode phase plate.

While taking the image, the position of the central, undiffracted beam relative to the device was changed. The time-dependent position was realized by an orbital motion of the undiffracted beam relative to the phase plate by using a conical beam tilt at the sample with a period less than the integration time used to acquire an image at the image detector 124. Here a rotation frequency of approximately 10 Hz was used. The hole diameter was approximately 1 μm, and the orbital radius larger than 0.8 times the radius of the hole. The recording time of the image was more than one second.

The orbital motion has the effect that the edge discontinuity caused by the phase plate is smeared out, thus smearing out the ripples in the image. Only a weak halo effect may remain, close to the strong-contrast features. Not only the rippling effect has largely disappeared, also the image can more easily be interpreted.

FIG. $4^a$ shows a simulated image of a sample imaged by a prior art phase plate with a central hole diameter of 1000 nm and a cut-on periodicity of 14.5 $nm^{-1}$. In this simulation, also described in Danev [-2-], paragraph 3, three modeled objects, object 401, with a diameter of 80 nm, object 402 with a diameter of 20 nm, and object 403 with a diameter of 10 nm are imaged. Clearly the strong ringing is visible. To better show the ringing the intensity variations along line AA' are shown in FIG. $4^b$.

FIG. $4^b$ shows the intensity variations along line AA' of FIG. $4^a$. Vertically the intensity is shown, ranging from 0 to 1.6, where 1 is the intensity far from the objects, and horizontally the position along line AA'. Round the largest diameter of object 401 (the edges) sharp maxima are visible. Also the ringing is quite discernable.

FIG. $4^c$ shows a similar image as FIG. $4^a$, but now the central hole diameter of the phase plate is 100 nm and the cut-on periodicity is 145 $nm^{-1}$.

Although less ringing is visible, a large halo is present around object 401 instead. Large in this instance implying both "well above an intensity of 1" as well as "extending to a large distance from object 401".

FIG. $4^d$ shows the intensity variations along line BB' of FIG. $4^c$. Vertically the intensity is shown, ranging from 0 to 1.6, where 1 is the intensity far from the objects, and horizontally the position along line BB'. Round the largest diameter of object 401 (the edges) a large halo is discernable, as a result of which an intensity above 1 is found to a large distance from object 401.

FIG. $4^e$ shows a simulated image of a sample imaged by an "orbital mode" phase plate with a central hole diameter of 1000 nm, an orbital radius of 450 nm and an effective cut-on of 145 nm. This image shows less ringing and halo than either $4^a$ or $4^c$.

FIG. $4^f$ shows the intensity variations along line CC' of figure e. Vertically the intensity is shown, ranging from 0 to 1.6, where 1 is the intensity far from the objects, and horizontally the position along line CC'. Halo is much less pronounced than in FIG. $4^d$ (phase plate with a hole of 0.1 μm), and ringing is almost absent.

It is noted that the large hole size is a big manufacturing advantage, while centering and adjusting the size of the orbital motion is easily done with the deflectors that are present in a TEM. Therefore this orbital mode phase plate combines improved image quality with ease of manufacturing.

The above embodiments discussed the advantage of orbital mode Zernike phase plates. Another group of phase enhancing devices are the Foucault knife contrast enhancing device, as described by e.g. Nagayama [-1-]. Here a part of the diffracted electrons is blocked by a knife edge placed in the diffraction plane of the TEM, blocking one half-plane. Phase contrast now arises by the interference of the undiffracted central beam and the diffracted electrons of the half plane that is not blocked. Similarly in a Hilbert device a phase shift of π is introduced between the two half planes.

FIG. 5 shows a view of a Foucault knife. The device shows a blocking member 52 mounted on a holder structure 50, the blocking member blocking half the plane. The device is positioned such, that the undiffracted beam is just passing past the edge along line 54.

It will be clear to the skilled artisan that between the undiffracted beam and the knife edge an area exists where the one half plane is not blocked. Quite suddenly the blocking arises where the knife edge is positioned. Therefore here as well a sudden change in the Fourier domain occurs, resulting in artifacts. By moving the knife edge with respect to the undiffracted beam (and the rest of the diffraction pattern) the sudden change is softened and less artifacts occur.

FIG. 6 schematically shows a variant of the Foucault knife.

Instead of blocking a half-plane, it can be more beneficial to block only part of the half-plane. An example of this is the so-called 'tulip' device as described in EP patent application publication EP2400523.

FIG. 6 shows a diffraction pattern overlaid with a blocking member 602. The blocking member is connected to the holder structure (not shown) via support arm 604. The blocking member is positioned close to the undiffracted beam 600.

It is noted that the blocking member is here formed as a half-circle with a straight edge. In the centre of the circle an indent is formed where the undiffracted beam can pass, so that these electrons do not impinge on the blocking member. This indent ensures a low frequency behavior of the blocking member for a low frequency that is identical in all directions. By now moving the blocking member with respect to the undiffracted beam (either in a circular movement or in a direction perpendicular to the straight edge of the blocking member) the required softening is achieved.

It is noted that also other contrast enhancing devices, such as the Fresnel like zone plate described in EP patent application EP12168997, or the Hilbert phase plate described in Nagayama [-1-] can benefit from this invention.

NON-PATENT LITERATURE

[-1-] "Phase Contrast Enhancement with Phase Plates in Biological Electron Microscopy", K. Nagayama et al., Microscopy Today, Vol. 18 No. 4 (July 2010), pp. 10-13.

[-2-] "Optimizing the phase shift and the cut-on periodicity of phase plates for TEM", R. Danev et al., Ultramicroscopy 111 (2011) pp 1305-1315.

The invention claimed is:

1. A method of forming an image of a sample in a transmission electron microscope, the sample irradiated by a beam of electrons and the sample splitting the beam of electrons in a beam of undiffracted electrons and beams of scattered electrons, the electron microscope equipped with a contrast enhancing device from the group of phase plates, Foucault devices or Hilbert devices, the contrast enhancing device for improving the contrast at low spatial frequencies, the contrast enhancing device positioned in the back focal plane of the objective lens or in an image of said plane, the contrast enhancing device having a position with respect to the beam of unscattered electrons, wherein:

during the formation of the image the mutual position of the contrast enhancing device and the beam of unscattered electrons is changed.

2. The method of claim 1 in which the contrast enhancing device is kept stationary with respect to the microscope and the beam is tilted with respect to the sample, the tilting of the beam resulting in a shift of the diffraction image formed in the back focal plane of the objective lens or in an image of said plane.

3. The method of claim 2 in which the beam describes a conical tilt with respect to the sample, resulting in a circular movement of the diffraction image formed in the back focal plane of the objective lens or in an image of said plane, the circular movement described by a circle with a diameter.

4. The method of claim 3 in which the phase enhancing device shows a hole and the diameter of the circle is between 0.5 and 1 times the diameter of the hole.

5. The method of claim 3 in which the phase enhancing device shows an edge and the excursions of the linear movement are between 0.5 and 1 times the distance to the edge.

6. The method of claim 2 in which the beam describes a time dependent tilt with respect to the sample, resulting in a linear movement of the diffraction image formed in the back focal plane of the objective lens or in an image of said plane, the linear movement described by a line segment and in a direction perpendicular to the straight edge of the contrast enhancing device.

7. The method of claim 1 in which the contrast enhancing device is mechanically moved with respect to the microscope in a plane perpendicular to the beam of the undiffracted electrons.

8. The method of claim 7 in which the contrast enhancing device describes a circle or a line segment with respect to the microscope.

9. The method of claim 8 in which the phase enhancing device has a hole and the diameter of the circle is between 0.5 and 1 times the diameter of the hole.

10. The method of claim 8 in which the phase enhancing device has an edge and the excursions of the linear movement are between 0.5 and 1 times the distance to the edge.

11. The method of claim 7 in which the phase enhancing device has a hole and the diameter of the circle is between 0.5 and 1 times the diameter of the hole.

12. The method of claim 7 in which the phase enhancing device has an edge and the excursions of the linear movement are between 0.5 and 1 times the distance to the edge.

13. The method of claim 1 in which the mutual position is changed in a repetitive manner, and the repetition frequency is between 1 Hz and 50 Hz, more specifically between 5 Hz and 20 Hz.

14. The method of claim 1 in which, while acquiring an image, a signal proportional to the current intercepted by the contrast enhancing device is used to center the beam with respect to the contrast enhancing device.

15. A Transmission Electron Microscope for acquiring an image of a sample, the microscope equipped with a phase enhancing device and a programmable controller for controlling the microscope, wherein the controller is programmed to control the microscope in such a manner that the beam is moved over the phase enhancing device while acquiring an image.

16. The Transmission Electron Microscope of claim 15 in which the controller controls deflectors to move the beam over the phase enhancing device while acquiring an image.

17. The Transmission Electron Microscope of claim 16 in which the microscope is equipped with means to measure a signal proportional to the current intercepted by the contrast enhancing device while acquiring an image and the signal is used to center the beam with respect to the contrast enhancing device.

18. The Transmission Electron Microscope of claim 15 in which the microscope is equipped with means to measure a signal proportional to the current intercepted by the contrast enhancing device while acquiring an image and the signal is used to center the beam with respect to the contrast enhancing device.

19. A method of forming an image of a sample in a transmission electron microscope, the electron microscope comprising a contrast enhancing device positioned in the back focal plane of the objective lens or in an image of said plane, the method comprising:

irradiating the sample with a beam of electrons;

splitting the beam of electrons into a beam of undiffracted electrons and beams of scattered electrons; and changing the mutual position of the contrast enhancing device and the beam of unscattered electons during the formation of the image.

20. The method of claim 19 in which the contrast enhancing device is a Foucault device or a Hilbert device.

* * * * *